United States Patent
Lee et al.

(10) Patent No.: US 9,276,232 B2
(45) Date of Patent: Mar. 1, 2016

(54) DISPLAY APPARATUS AND METHOD OF MANUFACTURING THE SAME

(71) Applicant: Samsung Display Co., LTD., Yongin, Gyeonggi-do (KR)

(72) Inventors: Jae-Man Lee, Yongin (KR); Seung-Joon Yoo, Yongin (KR); Jae-Wook Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 14/024,494

(22) Filed: Sep. 11, 2013

(65) Prior Publication Data
US 2014/0339510 A1 Nov. 20, 2014

(30) Foreign Application Priority Data
May 14, 2013 (KR) .................. 10-2013-0054643

(51) Int. Cl.
*H01L 29/08* (2006.01)
*H01L 51/52* (2006.01)
*H01L 27/32* (2006.01)

(52) U.S. Cl.
CPC .......... *H01L 51/524* (2013.01); *H01L 51/5246* (2013.01); *H01L 27/3244* (2013.01); *H01L 27/3248* (2013.01); *H01L 2251/566* (2013.01)

(58) Field of Classification Search
CPC ................................ C03C 3/066; C03C 3/091
USPC .......................................................... 257/40
See application file for complete search history.

(56) References Cited

U.S. PATENT DOCUMENTS

| | | | |
|---|---|---|---|
| 4,892,847 A | | 1/1990 | Reinherz |
| 5,250,112 A | * | 10/1993 | Wussow et al. ............... 106/453 |
| 7,619,031 B2 | * | 11/2009 | Kanayama et al. ........... 524/507 |
| 2008/0106194 A1 | | 5/2008 | Logunov et al. |
| 2008/0124558 A1 | * | 5/2008 | Boek et al. ..................... 428/427 |
| 2009/0247385 A1 | * | 10/2009 | Ide ................... 501/18 |
| 2011/0309339 A1 | * | 12/2011 | You et al. ......... 257/40 |
| 2011/0310465 A1 | * | 12/2011 | Takanashi et al. ............ 359/296 |
| 2012/0321902 A1 | | 12/2012 | Kohara et al. |
| 2013/0056710 A1 | | 3/2013 | Oh et al. |
| 2013/0174608 A1 | * | 7/2013 | Takeuchi et al. .................. 65/40 |

FOREIGN PATENT DOCUMENTS

| KR | 1990-0000306 | 1/1990 |
|---|---|---|
| KR | 2005-0016578 | 2/2005 |
| KR | 2008-0016457 | 2/2008 |
| KR | 2008-0041558 | 5/2008 |
| KR | 2008-0046401 | 5/2008 |
| KR | 2009-0041867 | 4/2009 |
| KR | 2009-0129822 | 12/2009 |

(Continued)

*Primary Examiner* — Thao X Le
*Assistant Examiner* — Patricia Reddington
(74) *Attorney, Agent, or Firm* — Lewis Roca Rothgerber Christie, LLP (57) ABSTRACT

A display apparatus and a method of manufacturing the same. The display apparatus includes a substrate, an encapsulation substrate disposed to face the substrate, a display unit formed between the substrate and the encapsulation substrate and displaying an image, and a sealing unit disposed between the substrate and the encapsulation substrate to bond the substrate and the encapsulation substrate to each other and containing a filler containing Cr, Cu, and Mn and a glass frit mixed with the filler.

19 Claims, 5 Drawing Sheets

(56) References Cited

FOREIGN PATENT DOCUMENTS

| KR | 10-0943187 B1 | 2/2010 |
| KR | 2010-0058335 | 6/2010 |
| KR | 2010-0129644 | 12/2010 |
| KR | 10-2011-0137561 A | 12/2011 |
| KR | 10-2013-0026807 A | 3/2013 |
| WO | WO 2004/000745 A1 | 12/2003 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2013-0054643, filed on May 14, 2013, in the Korean Intellectual Property Office, the disclosure of which is incorporated herein in its entirety by reference.

BACKGROUND

1. Field

The following description relates to a display apparatus and a method of manufacturing the same, and more particularly, to a display apparatus having increased encapsulation properties and durability and a method of manufacturing the same.

2. Description of the Related Art

Recently, the use of display apparatuses has become widespread and varied. Particularly, thicknesses of display apparatuses and weights thereof have reduced in such a way that a range of use thereof has become broader.

Such display apparatuses are formed by using various suitable methods. For example, display apparatuses may be each formed by using a method of disposing a display unit for implementing images between a substrate and an encapsulation substrate. In this case, the substrate and the encapsulation substrate are bonded by a sealing element.

It is necessary that the sealing element allows the substrate and the encapsulation substrate to be stably coupled with each other and that it also prevents penetration of external air, humidity, and other foreign substances into the display unit.

However, since it is difficult to form the sealing element, there is a limitation in improving encapsulation properties of display apparatuses. As a result thereof, there is a limitation in improving durability of display apparatuses.

SUMMARY

Aspects of embodiments of the present invention are directed toward a display apparatus having enhanced encapsulation properties and durability and a method of manufacturing the display apparatus.

According to an embodiment of the present invention, there is provided a display apparatus. The display apparatus includes a substrate, an encapsulation substrate disposed to face (to be opposite to) the substrate, a display unit formed between the substrate and the encapsulation substrate and for displaying an image, and a sealing unit disposed between the substrate and the encapsulation substrate to bond the substrate and the encapsulation substrate to each other and containing a filler containing Cr, Cu, and Mn and a glass frit mixed with the filler.

The filler may include an oxide form containing Cr, Cu, and Mn.

The filler may contain $Cu(CrMn)_2O_4$.

The filler may be black in color.

In this case, Cr may be contained in the filler as from about 30 to about 70 mole percentage with respect to the filler.

The filler may be contained in the sealing unit as from about 20 wt % to about 60 wt % with respect to the sealing unit.

The glass frit may contain at least one of vanadium oxide and bismuth oxide.

The vanadium oxide may contain $V_2O_5$ and the bismuth oxide may contain $Bi_2O_3$.

The glass frit may contain at least one selected from the group consisting of $TeO_2$, ZnO, and BaO.

The sealing unit may be disposed to surround the display unit, and a space between the substrate and the encapsulation substrate may be sealed by the sealing unit.

The display unit may include an organic light emitting device (OLED), and the OLED may include a first electrode, a second electrode, and an intermediate layer disposed between the first electrode and the second electrode and including an organic light emitting layer.

The display apparatus may further include a thin film transistor (TFT) electrically connected to the first electrode and including an active layer, a gate electrode electrically insulated from the active layer, a source electrode electrically connected to a first region of the active layer, and a drain electrode electrically connected to a second region of the active layer.

According to another embodiment of the present invention, there is provided a method of manufacturing a display apparatus. The method includes preparing a substrate and an encapsulation substrate disposed to be opposite to the substrate, forming a display unit disposed between the substrate and the encapsulation substrate and displaying an image, and bonding the substrate and the encapsulation substrate to each other by utilizing a sealing unit containing a filler containing Cr, Cu, and Mn and a glass frit mixed with the filler.

The bonding of the substrate and the encapsulation substrate to each other may include forming a preliminary sealing unit including a paste containing the glass frit and the filler on one surface of one of the substrate and the encapsulation substrate, sintering and drying the preliminary sealing unit, arranging the substrate and the encapsulation substrate, and changing the preliminary sealing unit into the sealing unit by melting and curing the preliminary sealing unit by emitting a laser beam thereto.

The paste may be formed by preparing a powder containing the glass frit and a powder containing the filler and adding a binder and a solvent to the powders.

The forming the preliminary sealing unit including the paste on one surface of one of the substrate and the encapsulation substrate may be performed by utilizing a screen printing method to allow the paste to be formed in a desired shape.

The preparing the substrate and the encapsulation substrate may include preparing a mother substrate larger than the substrate and a mother encapsulation substrate larger than the encapsulation substrate and cutting off the mother substrate and the mother encapsulation substrate after forming the sealing unit.

The display unit may be provided in a plurality thereof, and the cutting may be performed to separate the display units, respectively.

The sealing unit may be disposed to surround each of the plurality of display units.

The laser beam may have a wavelength from about 700 to about 900 nanometers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Expressions such as "at least one of," when preceding a list of elements, modify the entire list of elements and do not modify the individual elements of the list. Further, the use of "may" when describing embodiments of the present invention refers to "one or more embodiments of the present invention."

Reference will now be made in detail to embodiments, examples of which are illustrated in the accompanying drawings, wherein a size and a thickness of an element may be exaggerated for clarity and convenience of description.

In the drawings, like reference numerals refer to like elements throughout. A detailed description thereof will be omitted. Also, in a layer structure described later, expressions such as "above" or "on" may not only indicate being disposed right on top thereof in direct contact therewith but also indicate disposed above without contact therewith.

It will be further understood that the terms "comprises" and/or "comprising," when used in this specification, specify the presence of stated elements but do not preclude the presence or addition of one or more other elements and/or groups thereof. Also, it will be understood that "on" means "being located on a top or a bottom of an object but does not mean "being located above" based on the direction of gravity.

Hereinafter, exemplary embodiments of the present invention will be described in more detail to allow a person of ordinary skill to easily perform the same.

Figure 1:
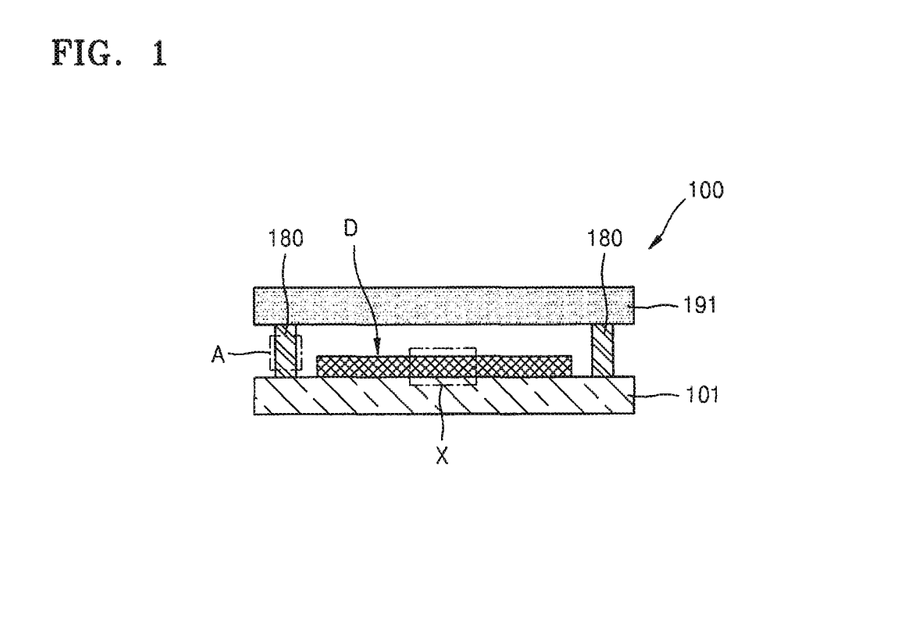
FIG. 1 is a schematic cross sectional view illustrating a display apparatus according to an embodiment of the present invention.
Figure 2:
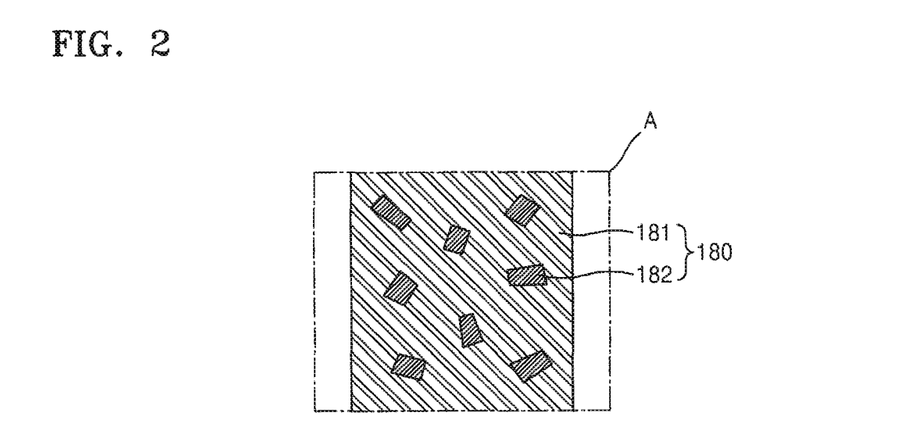
FIG. 2 is an enlarged view illustrating "A" shown in FIG. 1.

FIG. 1 is a schematic cross-sectional view illustrating a display apparatus 100 according to an embodiment of the present invention, and FIG. 2 is an enlarged view illustrating "A" shown in FIG. 1.

Referring to FIGS. 1 and 2, the display apparatus 100 includes a substrate 101, a display unit D, an encapsulation substrate 191, and a sealing unit 180.

The display unit may include various suitable display elements such as an organic light emitting device (OLED) or a liquid crystal element, which will be described in more detail below.

The substrate 101 may be formed of a transparent glass material whose main component is $SiO_2$. Also, the substrate 101 may be formed of a transparent plastic material. However, considering a laser beam emitted while forming the sealing unit 180, the substrate 101 may be formed of the glass material whose thermal resistance is superior to that of plastic.

The display unit D is formed on the substrate 101. The display unit D includes an OLED, a liquid crystal element, and other display elements to provide an image to be recognized by a user. A detailed description of the display unit D will be given below with reference to FIGS. 3 to 6.

The encapsulation substrate 191 is disposed to face (to be opposite to) the substrate 101. The display unit D is disposed between the substrate 101 and the encapsulation substrate 191. The encapsulation substrate 191 may be formed of a transparent glass material whose main component is $SiO_2$. Also, the encapsulation substrate 191 may be formed of a transparent plastic material. However, since a laser beam is emitted toward the encapsulation substrate 191 while forming the sealing unit 180, the encapsulation substrate 191 may be formed of the glass material whose thermal resistance is superior to that of plastic.

The sealing unit 180 is disposed between the substrate 101 and the encapsulation substrate 191. Although not shown in the drawings, the sealing unit 180 may be formed to surround the display unit D. The sealing unit 180 is disposed between the substrate 101 and the encapsulation substrate 191 to bond the substrate 101 and the encapsulation substrate 191 to each other. Also, a space between the substrate 101 and the encapsulation substrate 191 is sealed by the sealing unit 180. Accordingly, the display unit D disposed between the substrate 101 and the encapsulation substrate 191 is separated from external humidity, air, and other foreign substances. Thus, damage to the display unit D is reduced or prevented.

The sealing unit 180 contains glass frit 181 and a filler 182.

The glass frit 181 forms a body of the sealing unit 180 and is melted and cured by heat, thereby bonding the substrate 101 and the encapsulation substrate 191 to each other. The glass frit 181 contains various suitable materials.

In one embodiment, the glass frit 181 includes at least one of vanadium oxide and bismuth oxide. Particularly, the glass frit 181 may include $V_2O_5$ or $Bi_2O_3$. The vanadium oxide or the bismuth oxide, and more particularly, $V_2O_5$ or $Bi_2O_3$, may easily contact with materials of the filler 182, which will be described below, and easily receives heat applied to the filler 182.

Also, the glass frit 181 may contain various other suitable materials and may, e.g., include at least one selected from the group consisting of, for example, $TeO_2$, $ZnO$, $BaO$, $Nb_2O_5$, $SiO_2$, $Al_2O_3$, $ZrO_2$, and $P_2O_5$.

As an example of a component of the glass frit 181, the glass frit 181 may contain, with a weight percent wt % as a reference, from about 10 to about 30 wt % of $V_2O_5$, from about 5 to about 25 wt % of $TeO_2$, from about 5 to about 25 wt % of $ZnO$, and from about 0 to about 10 wt % of $BaO$, with respect to the sealing unit 180.

The filler 182 is mixed with the glass frit 181. The filler 182 allows a thermal expansion coefficient of the sealing unit 180 not to increase while a laser beam is emitted onto the precursor or preliminary sealing unit of sealing unit 180 to form the sealing unit 180, and more particularly, reduces a difference between thermal expansion rates of the sealing unit 180, the substrate 101, and the encapsulation substrate 191 to effectively bond the sealing unit 180, the substrate 101, and the encapsulation substrate 191 to one another.

Also, the filler 182 allows laser beam absorptance of the sealing unit 180 to be increased in such a way that the sealing unit 180 is evenly and rapidly formed to improve bonding properties of the substrate 101 and the encapsulation substrate 191 and to effectively seal the space between the substrate 101 and the encapsulation substrate 191. As a result, the display unit D is effectively prevented from being damaged by external gases, humidity, and other foreign substances.

The filler 182 may be black to allow the laser beam absorptance of the sealing unit 180 to be increased. Particularly, the filler 182 is formed of a material having excellent laser beam absorptance for a laser beam having a wavelength from about 700 to about 900 nanometers, and more particularly, from about 800 to about 810 nanometers.

For this, the filler 182 contains Cr, Cu, and Mn. Also, the filler 182 may contain an oxide form containing Cr, Cu, and Mn having a spinel structure. As a detailed example, the filler 182 may contain $Cu(CrMn)_2O_4$. Cr contained in the filler 182 is used to provide the black color in such a way that the filler 182 easily improves the laser beam absorptance of the sealing unit 180.

Cr contained in the filler 182 may be from about 30 to about 70 mole percentage with respect to the filler 182. In one embodiment, when Cr is contained to be less than about 30 mole percentage with respect to the filler 182, black properties of the filler 182 are reduced, thereby reducing the laser beam absorptance. Accordingly, Cr may be contained at about 30 mole percentage or more with respect to the filler 182. Also, in one embodiment, when Cr is contained at more than about 70 mole percentage with respect to the filler 182, the filler 182 is affected to not have the spinel structure, thereby reducing desired properties of the filler 182 at a high temperature. Accordingly, Cr may be contained at about 70 mole percentage or less with respect to the filler 182.

In this case, Cu forms a frame of the spinel structure together with Cr to allow physical properties of the filler 182 at a high temperature not to be easily changed and more particularly to allow the filler 182 to maintain the color thereof.

Also, Mn contained in the filler 182 allows the filler 182 to primarily contain the spinel structure. When the filler 182 does not contain Mn and the oxide form having the spinel structure is being manufactured by using only Cu and Cr, the filler 182 includes oxides having other suitable crystal structures in addition to the spinel structure as a bi-product. Durability of other crystal structures at a high temperature is less as compared relatively to the spinel structure, thereby reducing durability of the filler 182 at a high temperature. However, in the present embodiment, the filler 182 contains Mn in addition to Cu and Cr to form Cu(CrMn) and a stable spinel structure is formed therethrough.

The glass frit 181 and the filler 182 contained in the sealing unit 180 may be mixed within a proper range. In more detail, the filler 182 may be contained at from about 20 wt % to about 60 wt % with respect to the sealing unit 180. In one embodiment, when the filler 182 is contained in the sealing unit 180 at less than about 20 wt %, an excessive amount of the glass frit 181 is contained in the sealing unit 180 and the sealing unit 180 spreads due to its high fluidity while it is being sintered or irradiated by a laser beam emitted to form the sealing unit 180 in such a way that a width of the sealing unit 180 is excessively increased and it is difficult to maintain a desired form of the sealing unit 180. Particularly, in one embodiment, when the filler 182 is contained at less than about 20 wt %, it is difficult to provide an effect of improving the laser beam absorptance by using the filler 182 as described above while it is being irradiated by a laser beam to form the sealing unit 180. As a result thereof, desired properties of the melting and curing process, which are obtained through emitting the laser beam to form the sealing unit 180, may not be achieved. Accordingly, in one embodiment, the filler 182 of about 20 wt % or more is contained in the sealing unit 180.

Figure 3:
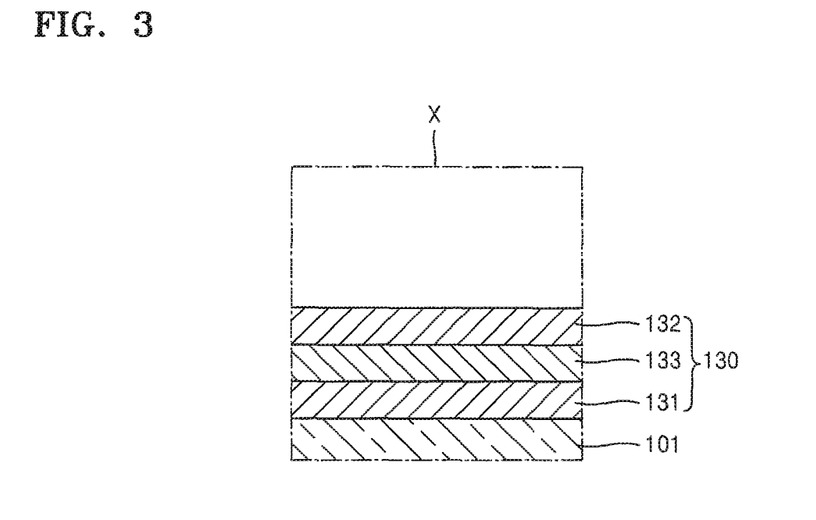
FIG. 3 is an enlarged view illustrating "X" shown in FIG. 1.

In one embodiment, when the filler 182 is contained in the sealing unit 180 at more than about 60 wt %, the glass frit 181 is excessively less contained in the sealing unit 180. The glass frit 181 is a part where melting and curing substantially occurs to form the sealing unit 180. That is, when the glass frit 181 is contained in the sealing unit 180 in an excessively small amount, although a laser beam is emitted onto the sealing unit 180, melting of the sealing unit 180 does not effectively occur and bonding between the substrate 101 and the encapsulation substrate 191 is not easily performed. That is, since the sealing unit 180 is imperfectly melted while bonding the substrate 101 and the encapsulation substrate 191 to each other, the substrate 101 and the encapsulation substrate 191 are not perfectly bonded to each other, and thus, the space between the substrate 101 and the encapsulation substrate 191 is not sealed. As a result thereof, the display unit D may be easily damaged and durability of the display apparatus 100 is reduced. Accordingly, in one embodiment, the filler 182 of about 60 wt % or less is contained in the sealing unit 180. The display unit D will now be described below. FIG. 3 is an enlarged view illustrating "X" shown in FIG. 1. Referring to FIGS. 1 and 3, the display unit D includes an organic light emitting device (OLED) 130. That is, in the present embodiment, a case in which the display unit D includes the OLED 130 will be described. However, the present invention is not limited thereto and the display unit D may include a liquid crystal display and other displays.

Referring to FIG. 3, the OLED 130 is formed on the substrate 101 and includes a first electrode 131, an intermediate layer 133, and a second electrode 132.

The first electrode 131 may function as an anode and the second electrode 132 may function as a cathode, in which the order of polarities may be reversed.

When the first electrode 131 functions as the anode, the first electrode 131 may include one of ITO, IZO, ZnO, $In_2O_3$ and the like, which have high work functions. Also, depending on a purpose and a design condition thereof, the first electrode 131 may further include a reflecting layer formed of one of Ag, Mg, Al, Pt, Pd, Au, Ni, Nd, Ir, Cr, Li, Yb, and Ca.

The intermediate layer 133 includes at least one organic light emitting layer for emitting a visible ray. Also, the intermediate layer 133 may selectively include at least one of a hole injection layer, a hole transport layer, an electron transport layer, and an electron injection layer.

When the second electrode 132 functions as the cathode, the second electrode may be formed of at least one of Ag, Mg, Al, Pt, Pd, Au, Ni, Nd, Ir, Cr, Li, and Ca. Also, the second electrode 132 may include at least one of ITO, IZO, ZnO and In2O3 to allow light transmission.

When a voltage is applied to the intermediate layer 133 through the first electrode 131 and the second electrode 132, the organic light emitting layer of the intermediate layer 133 emits the visible ray to form an image.

In the present embodiment, since the substrate 101 and the encapsulation substrate 191 are bonded to each other by using the sealing unit 180, the substrate 101 and the encapsulation substrate 191 are effectively bonded to each other and the space between the substrate 101 and the encapsulation substrate 191 is sealed, thereby effectively protecting the display unit D.

Also, the sealing unit 180 is manufactured to include the glass frit 181 and the filler 182. Particularly, the filler 182 contains at least Cr, Cu, and Mn and more particularly, contains in the oxide form having the spinel structure. As a detailed example, the filler 182 contains at least $Cu(CrMn)_2O_4$. Cr contained in the filler 182 embodies the black color to easily improve the laser beam absorptance of the sealing unit 180 including the filler, Cu forms the frame of the spinel structure together with Cr so as not to allow physical properties of the filler 182 at a high temperature to be easily changed, and maintains the color of the filler 182. Also, Mn contained in the filler 182 restrains the filler 182 not to contain other crystal structures besides the spinel structure, which has excellent durability at a high temperature, thereby improving the durability of the filler 182 at the high temperature.

Particularly, the filler 182 has excellent absorption for a laser beam, for example, having a wavelength from about 700 to about 900 nanometers, and more particularly, about 800 nanometers. Accordingly, a process of emitting a laser beam to form the sealing unit 180 is quickly performed and properties of the sealing unit 180 are improved. As a result thereof, bonding properties between the substrate 101 and the encapsulation substrate 191 are improved.

Also, in this case, the glass frit 181 contains $V_2O_5$, $TeO_2$, ZnO, and BaO, which are in effective contact with the filler 182 containing $Cu(CrMn)_2O_4$, thereby improving durability thereof through the filler 182. Particularly, while forming the sealing unit 180, it is easy to transfer heat of the laser beam through the filler in the process of emitting the laser beam, thereby improving melting and curing properties.

The display unit D may be variously modified, examples of which will be described below.

Figure 4:
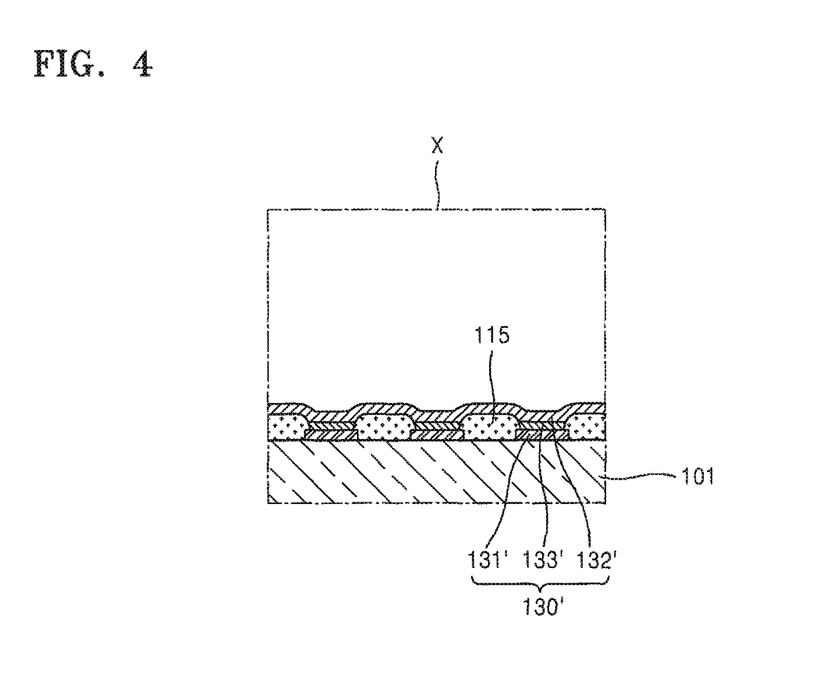
FIG. 4 is a schematic cross-sectional view illustrating a modified example of FIG. 3.

FIG. 4 is a schematic cross-sectional view illustrating a modified example of FIG. 3.

Referring to FIG. 4, an OLED 130' is formed on the substrate 101 and includes at least a first electrode 131', an intermediate layer 133', and a second electrode 132'.

In detail, the first electrode 131' is formed on the substrate 101. A pixel definition film 115 is formed on the first electrode 131' to expose a certain area of the first electrode 131'.

The intermediate layer 133' is formed on the first electrode 131' to be in contact with the first electrode 131'.

The second electrode 132' is formed on the intermediate layer 133'.

The first electrode 131' may function as an anode and the second electrode 132' may function as a cathode, in which the order of polarities may be reversed. The intermediate layer 133' includes an organic light emitting layer emitting a visible ray. Also, the intermediate layer 133' may selectively include at least one of a hole injection layer (HIL), a hole transport layer (HTL), an electron transport layer (ETL), and an electron injection layer (EIL).

In this case, the intermediate 133' may provide several colors such as red, green, and blue. As another example, the intermediate 133' may provide one color. For example, when the intermediate layer 133' provides white, a color conversion element such as a color filter may be included in addition to the intermediate layer 133'.

Since materials forming the first electrode 131' and the second electrode 132' are the same as the previous embodiment, a detailed description thereof will not be repeated here.

Figure 5:
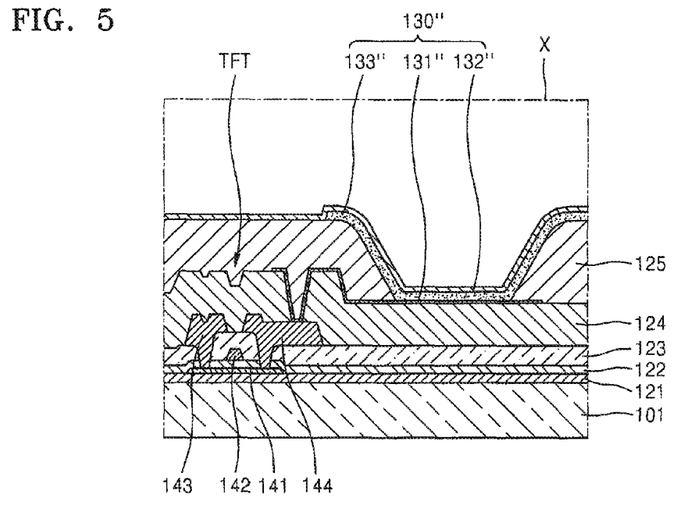
FIG. 5 is a schematic cross-sectional view illustrating another modified example of FIG. 3.

FIG. 5 is a schematic cross-sectional view illustrating another modified example of FIG. 3.

Referring to FIG. 5, the display unit D includes an OLED 130" and a thin film transistor (TFT), and the OLED 130" includes a first electrode 131", an intermediate layer 133", and a second electrode 132".

The TFT includes an active layer 141, a gate electrode 142, a source electrode 143, and a drain electrode 144.

A buffer layer 121 is formed on the substrate 101. The active layer 141 having a certain pattern is formed on the buffer layer 121. The active layer 141 may be formed of one of an inorganic semiconductor (such as a silicon semiconductor), an organic semiconductor, and an oxide semiconductor; and includes a source region, a drain region, and a channel region.

A gate insulating film 122 is formed on a top of the active layer 141, and the gate electrode 142 is formed on a certain area of a top of the gate insulating film 122. The gate insulating film 122 is to insulate the active layer 141 from the gate electrode 142 and may be formed of at least one of an organic material and an inorganic material. The inorganic material may be SiNx or SiO2.

The gate electrode 142 may contain at least one of Au, Ag, Cu, Ni, Pt, Pd, Al, and Mo or may include an alloy such as an Al:Nd alloy or a Mo:W alloy; but the present invention is not limited thereto and may be formed of various suitable materials considering electric resistance and processability.

An interlayer insulating film 123 is formed on a top of the gate electrode 142. The interlayer insulating film 123 and the gate insulating film 122 are formed to expose the source region and the drain region of the active layer 141, and the source electrode 143 and the drain electrode 144 are formed to be in contact with the source region and the drain region of the active layer 141.

The source electrode 143 and the drain electrode 144 may be formed of various suitable conductive materials and may have a single layer structure or a double layer structure.

A passivation layer 124 is formed on a top of the TFT. In more detail, the passivation layer 124 is formed on tops of the source electrode 143 and the drain electrode 144.

The passivation layer 124 is formed not to cover the entire top surface of the drain electrode 144 but to expose a certain area thereof, and the first electrode 131" is formed to be connected to the exposed part of the drain electrode 144.

The pixel definition film 125 is formed on the first electrode 131" by using an insulating material. The pixel definition film 125 is formed to expose a certain area of the first electrode 131".

The intermediate layer 133" is formed to be in contact with an exposed part of the first electrode 131". Also, the second electrode 132" is formed to be connected to the intermediate layer 133".

Figure 6:
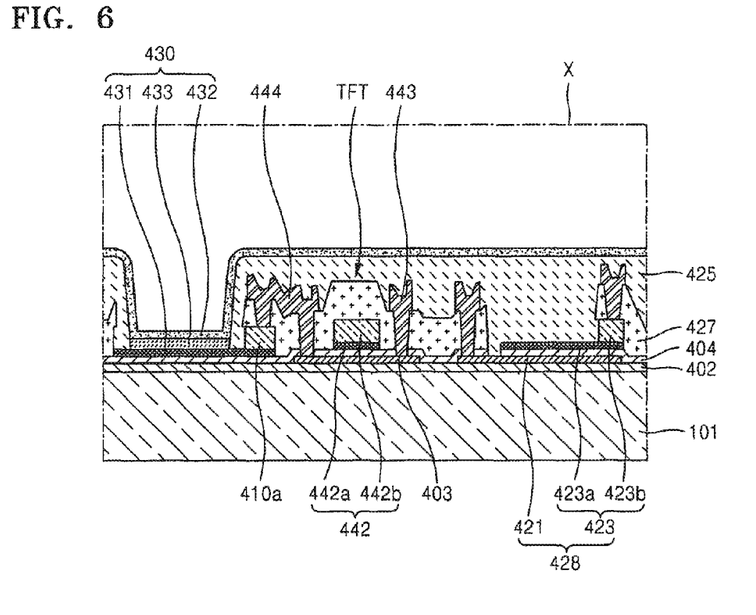
FIG. 6 is a schematic cross-sectional view illustrating still another modified example of FIG. 3.

FIG. 6 is a schematic cross-sectional view illustrating still another modified example of FIG. 3.

Referring to FIG. 6, the display unit D includes an OLED 430 and a TFT. The OLED 430 includes a first electrode 431, an intermediate layer 433, and a second electrode 432.

The TFT includes an active layer 403, a gate electrode 442, a source electrode 443, and a drain electrode 444.

A buffer layer 402 is formed on the substrate 101. The active layer 403 having a certain pattern is formed on the buffer layer 402. Also, a first capacitor electrode 421 is formed on the buffer layer 402. The first capacitor electrode 421 may be formed of the same material as that of the active layer 403.

A gate insulating film 404 is formed on the buffer layer 402 to cover the active layer 403 and the first capacitor electrode 421.

The gate electrode 442, the first electrode 431, and a second capacitor electrode 423 are formed on the gate insulating film 406.

The gate electrode 442 includes a first conductive layer 442a and a second conductive layer 442b.

The first electrode 431 may be formed of the same material as that of the first conductive layer 442a. A conductive part 410a is disposed on a certain area of a top of the first electrode 431 and is formed of the same material as that of the second conductive layer 442b.

The second capacitor electrode 423 includes a first layer 423a and a second layer 423b. The first layer 423a is formed of the same material as that of the first conductive layer 442a, and the second layer 423b is formed of the same material as that of the second conductive layer 442b. The second layer 423b is formed on the first layer 423a to be smaller than the first layer 423a. Also, the second capacitor electrode 423 overlaps the first capacitor electrode 421 and is formed to be smaller than the first capacitor electrode 421.

An interlayer insulating film 427 is formed on the first electrode 431, the gate electrode 442, and the second capacitor electrode 423. The source electrode 443 and the drain electrode 444 are formed on the interlayer insulating film 427.

The source electrode 443 and the drain electrode 444 are formed to be connected to the active layer 403.

Also, one of the source electrode 443 and the drain electrode 444 is electrically connected to the first electrode 431. In FIG. 6, the drain electrode 444 is electrically connected to the first electrode 431. In more detail, the drain electrode 444 is in contact with the conductive part 410a.

A pixel definition film 425 is formed on the interlayer insulating film 427 to cover the source electrode 443, the drain electrode 444, and a capacitor 428.

The pixel definition film 425 is formed not to cover a certain area of a top surface of the first electrode 431, and the intermediate layer 433 is formed to be in contact with an exposed area of the top surface of the first electrode 431.

The second electrode 432 is formed on the intermediate layer 433.

FIGS. 7A to 7F are views sequentially illustrating a method of manufacturing a display apparatus according to an embodiment of the present invention.

In more detail, FIGS. 7A to 7F illustrate a method of manufacturing the display apparatus 100 of FIG. 1.

Figure 7A:
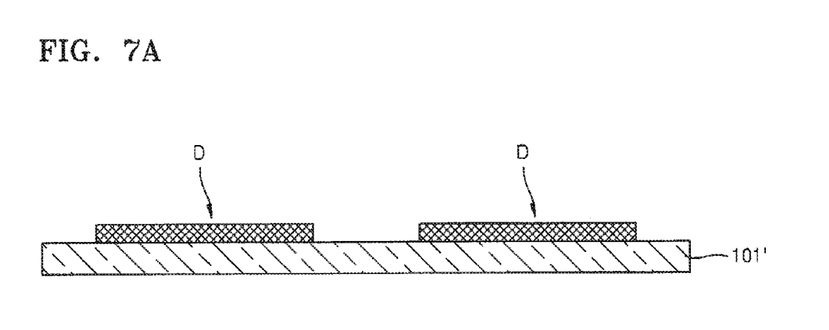
FIGS. 7A to 7F are views sequentially illustrating a method of manufacturing a display apparatus according to an embodiment of the present invention.

Referring to FIG. 7A, a mother substrate 101' is prepared. The mother substrate 101' may be formed of one of glass, plastic, and other suitable materials, and more particularly, may be formed of transparent glass. One or more display units D are formed on the mother substrate 101'. In FIG. 7A, two display units D are formed. However, the number of display units D on the mother substrate 101' is not limited thereto.

Figure 7B:
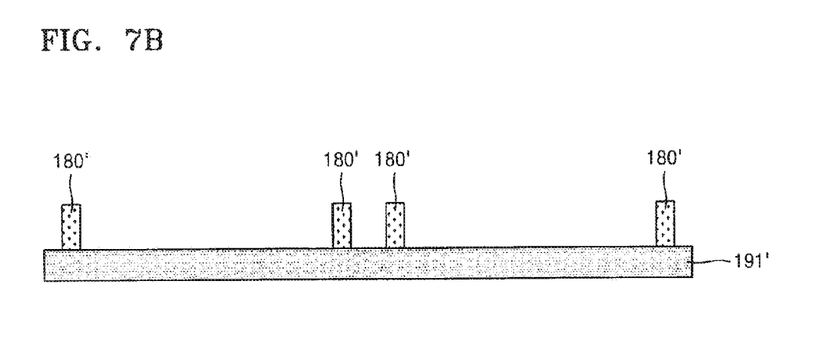

Also, referring to FIG. 7B, a preliminary sealing unit 180' is formed on a mother encapsulation substrate 191'. The preliminary sealing unit 180' may be formed corresponding to locations surrounding the display units D of the mother substrate 101' while being formed on the mother encapsulation substrate 191'.

The preliminary sealing unit 180' is formed on the mother encapsulation substrate 191' as a paste. In more detail, the preliminary sealing unit 180' is a paste containing glass frit and a filler. Since the glass frit and the filler are the same as those described above, a detailed description thereof will not be repeated here. Although not shown in the drawings, as a selective other embodiment, the preliminary sealing unit 180' may be formed on one surface of the mother substrate 101' to surround the display unit D.

An example of manufacturing the preliminary sealing unit 180' having the form of the paste will be described in more detail as follows. Powder containing the glass frit and powder containing the filler are prepared. Also, a binder and other solvents are added to the powders, thereby preparing the paste. Then, the paste is formed on the mother encapsulation substrate 191' in a desired shape, thereby forming the preliminary sealing unit 180'. In this case, the preliminary sealing unit 180' may be formed on the mother encapsulation substrate 191' in the desired shape by using a screen printing method.

Then, the preliminary sealing unit 180' having the form of the paste is sintered and dried to maintain the shape of the preliminary sealing unit 180'.

Figure 7C:
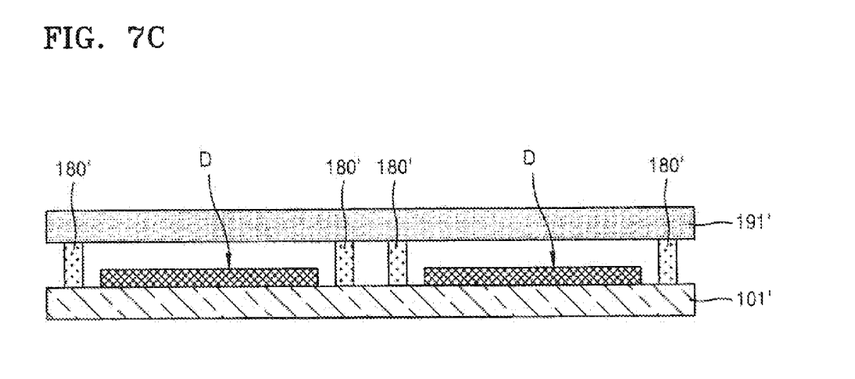

Then, referring to FIG. 7C, the mother encapsulation substrate 191' is disposed to face (to be opposite to) the mother substrate 101', in which the mother encapsulation substrate 191' is arranged with respect to the mother substrate 101' to allow the preliminary sealing unit 180' to be disposed to surround the display units D.

Figure 7D:
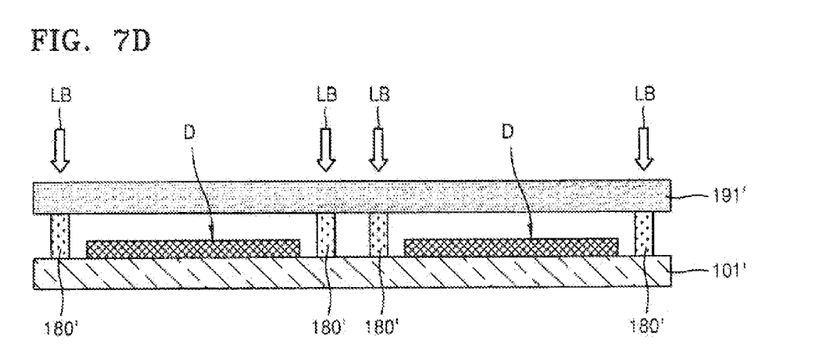

Then, referring to FIG. 7D, a laser beam LB is emitted onto a top of the mother encapsulation substrate 191'. In more detail, the laser beam LB is emitted onto a position to correspond to the preliminary sealing unit 180'. When the laser beam LB is emitted, the preliminary sealing unit 180' is melted and cured in such a way that the mother substrate 101' and the mother encapsulation substrate 191' are bonded to each other.

In this case, the laser beam LB has a wavelength from about 700 to about 900 nanometers. In detail, the laser beam LB may have a wavelength of about 800 nanometers, and more particularly, may have a wavelength of 810 nanometers.

When the absorptance of the preliminary sealing unit 180' for the laser beam LB is low while emitting the laser beam LB, a part of the preliminary sealing unit 180' is not melted. A less melted area of the preliminary sealing unit 180' notably deteriorates bonding properties between the mother substrate 101' and the mother encapsulation substrate 191' and a space between the mother substrate 101' and the mother encapsulation substrate 191', formed as the preliminary sealing unit 180', is not perfectly sealed, and thus, external gases, humidity, and other foreign substances may easily damage the display unit D.

However, in the present embodiment, the preliminary sealing unit 180' contains the glass frit and the filler and, as described above, the laser beam absorptance of the preliminary sealing unit 180' is notably improved due to the filler, and thus, the preliminary sealing unit 180' is effectively melted to effectively bond the mother substrate 101' and the mother encapsulation substrate 191' to each other.

Also, the preliminary sealing unit 180' is melted in a very short amount of time. Thus, by reducing the amount of time for emitting the laser beam LB, damage to the preliminary sealing unit 180', the mother encapsulation substrate 191', and the display unit D may be effectively prevented.

Figure 7E:
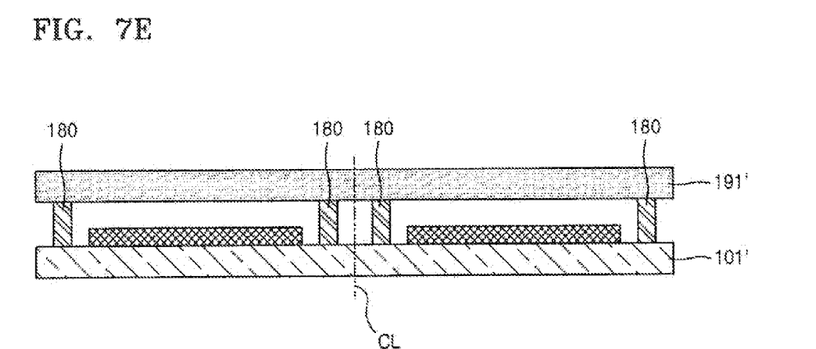

Through the emission of the laser beam LB, the preliminary sealing unit 180', as shown in FIG. 7E, is changed into the sealing unit 180 bonding the mother substrate 101' and the mother encapsulation substrate 191' to each other.

Figure 7F:
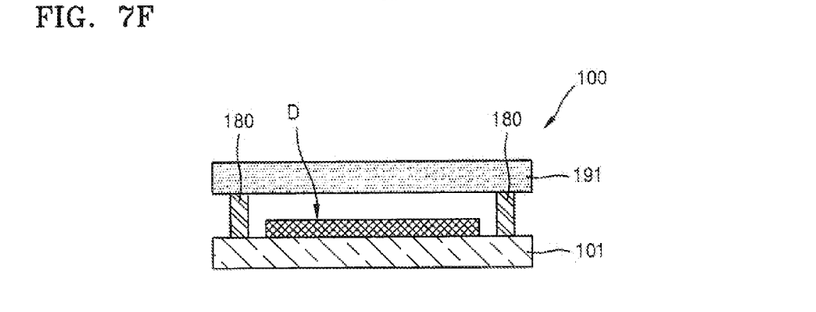

Referring to FIG. 7E, the mother substrate 101' and the mother encapsulation substrate 191' are cut off based on a cutting-plane line CL. As a result thereof, finally, the display apparatus 100 is manufactured as shown in FIG. 7F.

When manufacturing the display apparatus 100 by using the method according to the present embodiment as described above, properties of the sealing unit are improved while forming the sealing unit 180, thereby improving the bonding properties between the substrate 101 and the encapsulation substrate 191. As a result thereof, damage to the display unit D is reduced or prevented and durability of the display apparatus 100 is easily improved.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A display apparatus comprising:
   a substrate;
   an encapsulation substrate facing the substrate;
   a display unit between the substrate and the encapsulation substrate and for displaying an image; and
   a sealing unit between the substrate and the encapsulation substrate to bond the substrate and the encapsulation substrate to each other, the sealing unit comprising a filler and a glass frit mixed with the filler, and the filler consisting of an oxide form of Cr, Cu, and Mn.

2. The display apparatus of claim 1, wherein the filler comprises $Cu(CrMn)_2O_4$.

3. The display apparatus of claim 1, wherein the filler is black in color.

4. The display apparatus of claim 1, wherein Cr is contained in the filler at from about 30 to about 70 mole percentage with respect to the filler.

5. The display apparatus of claim 1, wherein the filler is contained in the sealing unit at from about 20 wt % to about 60 wt % with respect to the sealing unit.

6. The display apparatus of claim 1, wherein the glass frit contains at least one of vanadium oxide and bismuth oxide.

7. The display apparatus of claim 6, wherein the vanadium oxide comprises $V_2O_5$ and the bismuth oxide contains $Bi_2O_3$.

8. The display apparatus of claim 6, wherein the glass frit contains at least one selected from the group consisting of $TeO_2$, ZnO, and BaO.

9. The display apparatus of claim 1, wherein the sealing unit is disposed to surround the display unit, and
wherein a space between the substrate and the encapsulation substrate is sealed by the sealing unit.

10. The display apparatus of claim 1, wherein the display unit comprises an organic light emitting device (OLED), and
wherein the OLED comprises a first electrode, a second electrode, and an intermediate layer between the first electrode and the second electrode, the intermediate layer comprising an organic light emitting layer.

11. The display apparatus of claim 10, further comprising a thin film transistor (TFT) electrically connected to the first electrode and comprising an active layer, a gate electrode electrically insulated from the active layer, a source electrode electrically connected to a first region of the active layer, and a drain electrode electrically connected to a second region of the active layer.

12. A method of manufacturing a display apparatus, the method comprising:
preparing a substrate and an encapsulation substrate;
forming a display unit for displaying an image between the substrate and the encapsulation substrate; and
bonding the substrate and the encapsulation substrate to each other by utilizing a sealing unit comprising a filler and a glass frit mixed with the filler, the filler consisting of an oxide form of Cr, Cu, and Mn.

13. The method of claim 12, wherein the bonding of the substrate and the encapsulation substrate to each other comprises:
forming a preliminary sealing unit comprising a paste containing the glass frit and the filler on one surface of one of the substrate and the encapsulation substrate;
sintering and drying the preliminary sealing unit;
arranging the substrate and the encapsulation substrate; and
changing the preliminary sealing unit into the sealing unit by melting and curing the preliminary sealing unit by emitting a laser beam thereto.

14. The method of claim 13, wherein the paste is formed by preparing a powder containing the glass frit and a powder containing the filler and adding a binder and a solvent to the powders.

15. The method of claim 13, wherein the forming of the preliminary sealing unit comprising the paste on one surface of one of the substrate and the encapsulation substrate is performed by utilizing a screen printing method to allow the paste to be formed in a desired shape.

16. The method of claim 13, wherein the laser beam has a wavelength from about 700 to about 900 nanometers.

17. The method of claim 12, wherein the preparing of the substrate and the encapsulation substrate comprises:
preparing a mother substrate larger than the substrate and a mother encapsulation substrate larger than the encapsulation substrate; and
cutting off the mother substrate and the mother encapsulation substrate after forming the sealing unit.

18. The method of claim 17, wherein a plurality of display units comprise the display unit, and
wherein the cutting is performed to separate each of the plurality of display units from one another.

19. The method of claim 18, wherein the sealing unit is disposed to surround each of the plurality of display units.

* * * * *